United States Patent
Hekmatshoar-Tabari et al.

(10) Patent No.: US 9,231,146 B2
(45) Date of Patent: Jan. 5, 2016

(54) SILICON PHOTOVOLTAIC ELEMENT AND FABRICATION METHOD

(75) Inventors: Bahman Hekmatshoar-Tabari, Mount Kisco, NY (US); Devendra K. Sadana, Pleasantville, NY (US); Ghavam G. Shahidi, Round Ridge, NY (US); Davood Shahrjerdi, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 431 days.

(21) Appl. No.: 13/607,855

(22) Filed: Sep. 10, 2012

(65) Prior Publication Data
US 2013/0244372 A1    Sep. 19, 2013

Related U.S. Application Data

(63) Continuation of application No. 13/032,826, filed on Feb. 23, 2011.

(51) Int. Cl.
| | |
|---|---|
| *H01L 31/028* | (2006.01) |
| *H01L 31/18* | (2006.01) |
| *H01L 31/0216* | (2014.01) |
| *H01L 31/0224* | (2006.01) |
| *H01L 31/068* | (2012.01) |

(Continued)

(52) U.S. Cl.
CPC .......... *H01L 31/18* (2013.01); *H01L 31/02167* (2013.01); *H01L 31/022425* (2013.01); *H01L 31/065* (2013.01); *H01L 31/068* (2013.01); *H01L 31/074* (2013.01); *H01L 31/1804* (2013.01); *Y02E 10/547* (2013.01)

(58) Field of Classification Search
USPC .................................................. 136/252–265
See application file for complete search history.

(56) References Cited

U.S. PATENT DOCUMENTS

| | | | |
|---|---|---|---|
| 2004/0103937 A1* | 6/2004 | Bilyalov et al. ............... | 136/255 |
| 2008/0230116 A1 | 9/2008 | Kannou et al. | |
| 2009/0014063 A1 | 1/2009 | Stangl et al. | |

(Continued)

FOREIGN PATENT DOCUMENTS

WO    2009094578 A2    7/2009

OTHER PUBLICATIONS

Schmidt et al., Surface Passivation of High-Efficiency Silicon Solar Cells by Atomic-Layer-Deposited Al2O3, Progress in Photovoltaics: Reseach and Applications, pp. 461-466 (2008).*

(Continued)

*Primary Examiner* — Jayne Mershon
(74) *Attorney, Agent, or Firm* — Scully, Scott, Murphy & Presser P.C.; Louis J. Percello, Esq.

(57) ABSTRACT

A method of forming a photovoltaic device that includes providing an absorption layer of a first crystalline semiconductor material having a first conductivity type, and epitaxially growing a second crystalline semiconductor layer of a second conductivity type that is opposite the first conductivity type. The first conductivity type may be p-type and the second conductivity type may be n-type, or the first conductivity type may be n-type and the second conductivity type may be p-type. The temperature of the epitaxially growing the second crystalline semiconductor layer does not exceed 500° C. Contacts are formed in electrical communication with the absorption layer and the second crystalline semiconductor layer.

16 Claims, 5 Drawing Sheets

(51) Int. Cl.
*H01L 31/065* (2012.01)
*H01L 31/074* (2012.01)

(56) References Cited

U.S. PATENT DOCUMENTS

| | | |
|---|---|---|
| 2009/0211627 A1* | 8/2009 | Meier et al. .................. 136/255 |
| 2009/0215219 A1 | 8/2009 | Ajiki et al. |
| 2010/0105190 A1 | 4/2010 | Ferre |
| 2010/0186802 A1 | 7/2010 | Borden |
| 2010/0218826 A1 | 9/2010 | Hahn et al. |
| 2010/0243036 A1 | 9/2010 | Herguth et al. |
| 2011/0067753 A1* | 3/2011 | Korevaar et al. ............. 136/255 |
| 2011/0146791 A1* | 6/2011 | Teplin et al. ................. 136/258 |
| 2011/0203648 A1* | 8/2011 | Carey et al. .................. 136/255 |
| 2011/0203664 A1 | 8/2011 | Howell et al. |
| 2011/0247688 A1* | 10/2011 | Yoon et al. ................... 136/256 |
| 2011/0272021 A1 | 11/2011 | Takahashi et al. |
| 2012/0171852 A1* | 7/2012 | Yuan et al. .................... 438/488 |

OTHER PUBLICATIONS

U.S. Office Action dated Jan. 8, 2014 issued in U.S. Appl. No. 13/032,826.

Mahan, A.H. et al., "Influence of Microstructure on the Photoconductivity of Glow Discharge Depostied Morphous SiC: H and amorpohous SiGe:H alloys" Applied Physics Letters (Feb. 1987) pp. 335-337, vol. 50.

Posthuma, N.E. et al., "Surface Passivation for Germanium Photovoltaic Cells" Solar Energy Materials & Solar Cells (2005) pp. 37-45, vol. 88.

Office Action dated Oct. 16, 2014 received in U.S. Appl. No. 13/032,826.

* cited by examiner

SILICON PHOTOVOLTAIC ELEMENT AND FABRICATION METHOD

CROSS REFERENCE TO RELATED APPLICATION

This application is a continuation of U.S. patent application Ser. No. 13/032,826, filed Feb. 23, 2011, the entire content and disclosure of which is incorporated herein by reference.

BACKGROUND

The present disclosure relates to photovoltaic devices, and more particularly to photovoltaic devices such as, for example, solar cells.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of a band gap of the irradiated material.

The direction of travel of charged particles, i.e., the electrons and holes, in an irradiated material is sufficiently random, and may be referred to as carrier "diffusion". Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, an electric field is generated from the direction of the n-doped region toward the p-doped region. Electrons generated in the intrinsic and p-doped regions drift towards the n-doped region due to the electric field, and holes generated in the intrinsic and n-doped regions drift towards the p-doped region. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

BRIEF SUMMARY

In one embodiment, a method of forming a photovoltaic device is provided that employs a low temperature chemical vapor deposition (CVD) method to provide an epitaxial crystalline semiconductor layer on the absorption layer of the photovoltaic device. In one embodiment, the method of forming the photovoltaic device may begin with providing at least an absorption layer of a first crystalline semiconductor material having a first conductivity type. A second crystalline semiconductor layer may then be epitaxially grown on the absorption layer, in which the second crystalline semiconductor layer has a second conductivity type that is opposite the first conductivity type. The temperature of the epitaxially growth process is less than 500° C. Contacts may be formed in electrical communication with the absorption layer and the second crystalline semiconductor layer.

In another aspect, the present disclosure provides a photovoltaic device, such as a solar cell. In one embodiment, the photovoltaic device includes an absorption layer composed of a crystalline semiconductor material. The crystalline semiconductor material of the absorption layer is doped to a first conductivity type. An epitaxial semiconductor material is in direct contact with the absorption layer. The epitaxial semiconductor material is doped to a second conductivity type that opposite the first conductivity type of the absorption layer. A passivation layer composed of an intrinsic amorphous semiconductor material is in direct contact with the epitaxial semiconductor material.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
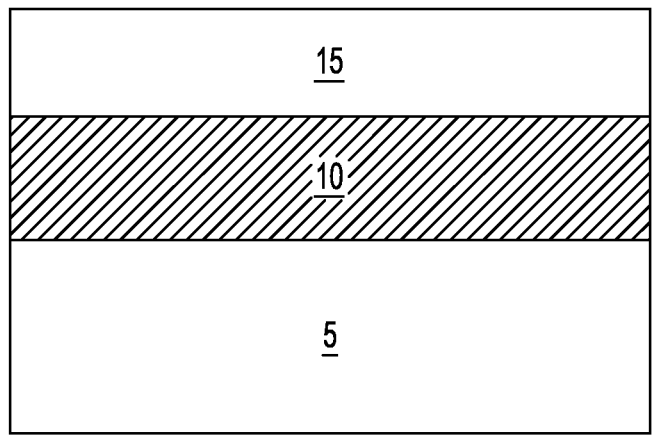
FIG. 1 is a side cross-sectional view of epitaxially growing a second crystalline semiconductor layer having a second conductivity type on an absorption layer of a first crystalline semiconductor material having a first conductivity type, wherein a back surface field layer is present underlying the absorption layer, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one embodiment, the present disclosure provides a photovoltaic device, and a method of forming the same, in which an epitaxial crystalline semiconductor layer is formed on the absorption layer of the photovoltaic device using a low temperature chemical vapor deposition (CVD) method. Heterojunction with intrinsic thin layer (HIT) solar cells have reached 23% efficiency in the laboratory and 21% efficiency in production. The HIT cells are comprised of thin stacks of intrinsic/doped hydrogenated amorphous silicon (a-Si:H) serving as the front (emitter) and back contacts, on an absorption layer composed of single-crystalline silicon (c-Si). Although, the hydrogenated amorphous silicon provides for low processing temperatures and higher open circuit voltages, it has been determined that hydrogenated amorphous silicon when employed as a component of the emitter of a solar cell disadvantageously absorbs sunlight. Because hydrogenated amorphous silicon absorbs sunlight, when utilized as the emitter of a solar cell, the hydrogenated amorphous silicon can result in a decreased short circuit current when compared to solar cells having a crystalline emitter. In some embodiments, the structures and methods disclosed herein provide a solar cell that reduces light absorption in the emitter region of the solar cell, while maintaining the advantage of the low temperature processing that is typical for forming an emitter region including hydrogenated amorphous silicon as employed in HIT solar cells.

FIGS. 1-4 depict one embodiment of forming a photovoltaic device, such as a solar cell, in which at least a portion of the emitter component of the photovoltaic device is formed by growing doped epitaxial layers by plasma-enhanced chemical vapor deposition (PECVD) at temperatures of less than 500° C. from a mixture of silane ($SiH_4$), hydrogen ($H_2$), and dopant gasses, such as phosphine ($PH_3$) and diboration ($B_2H_6$). The doped epitaxial layers that provide the emitter region of the photovoltaic device are typically formed directly on the surface of an absorption layer of the photovoltaic device. In some embodiments, the temperature for the formation of the epitaxial layers of at least a portion of the emitter component of the photovoltaic device may be less than 200° C.

As used herein, a "photovoltaic device" is a device, such as a solar cell, that produces free electrons-hole pairs, when exposed to radiation, such as light, and results in the production of an electric current. The photovoltaic device typically includes layers of p-type conductivity and n-type conductivity that share an interface to provide a junction. The "absorption layer" of the photovoltaic device is the material that readily absorbs photons to generate charge carriers, i.e., free electrons or holes. A portion of the photovoltaic device, between the front side and the junction is referred to as the "emitter layer", and the junction is referred to as the "emitter junction". The emitter layer may be present atop the absorption layer, in which the emitter layer has a conductivity type that is opposite the conductivity type as the absorption layer. In one example, when the Sun's energy in the form of photons collects in the cell layers, electron-hole pairs are generated in the material within the photovoltaic device. The emitter junction provides the required electric field for the collection of the photo-generated electrons and holes on the p-doped and n-doped sides of the emitter junction, respectively. For this reason, and in this example, at least one p-type layer of the photovoltaic device may provide the absorption layer, and at least one adjacent n-type layer may provide the emitter layer.

FIG. 1 depicts one embodiment of epitaxially growing a second crystalline semiconductor layer 15 having a second conductivity type on an absorption layer 10 of a first crystalline semiconductor material having a first conductivity type. As used herein, the term "conductivity type" denotes a semiconductor material being p-type or n-type. In one embodiment, the second crystalline semiconductor layer 15 is doped to an n-type conductivity type and the absorption layer 10 is doped to a p-type conductivity type. In another embodiment, the second crystalline semiconductor layer 15 is doped to a p-type conductivity type and the absorption layer 10 is doped to an n-type conductivity type.

The absorbing layer 10 may be composed of a crystalline semiconductor material. In one embodiment, the crystal structure of the crystalline semiconductor material is of a single crystal crystalline structure. The term "single crystal crystalline structure" denotes a crystalline solid, in which the crystal lattice of the entire sample is substantially continuous and substantially unbroken to the edges of the sample, with substantially no grain boundaries. In another embodiment, the crystalline semiconductor material of the absorption layer 10 is of a multi-crystalline or polycrystalline structure. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns). The crystalline semiconductor material of the absorption layer 10 is typically a silicon containing material. In one embodiment, the absorption layer 10 is composed of at least one of Si, Ge, SiGe, SiC, and SiGeC. In yet another embodiment, the absorption layer 10 may be a compound semiconductor, such as a type III-IV semiconductors, e.g., GaAs. In one example, the crystalline semiconductor material of the absorption layer 10 is composed of single crystal Si. In one embodiment, the absorption layer 10 of the first crystalline semiconductor material having a first conductivity type has a thickness ranging from 50 nm to 1 mm. In another embodiment, the absorption layer 10 of the first crystalline semiconductor material having a first conductivity type has a thickness ranging from 1 μm to 500 μm.

The first conductivity type of the crystalline semiconductor material that provides the absorption layer 10 may be provided by a p-type dopant or an n-type dopant. As used herein, "p-type" refers to the addition of impurities to an intrinsic semiconductor that creates deficiencies of valence electrons (i.e. holes). In a silicon containing absorption layer 10, examples of p-type dopants, i.e., impurities, include but are not limited to, boron, aluminum, gallium and indium. In one embodiment, in which the first conductivity type of the crystalline semiconductor material of the absorbing layer 10 is p-type, the p-type dopant is present in a concentration ranging from $1\times10^9$ atoms/cm$^3$ to $1\times10^{20}$ atoms/cm$^3$. In another embodiment, in which the first conductivity type is p-type, the p-type dopant is present in a concentration ranging from $1\times10^{14}$ atoms/cm$^3$ to $1\times10^{19}$ atoms/cm$^3$. As used herein, "n-type" refers to the addition of impurities that contributes free electrons to an intrinsic semiconductor. In a silicon containing absorption layer 10, examples of n-type dopants, i.e., impurities, include but are not limited to, antimony, arsenic and phosphorous. In one embodiment, in which the first conductivity type of the crystalline semiconductor material of the absorbing layer 10 is n-type, the n-type dopant is present in a concentration ranging from $1\times10^9$ atoms/cm$^3$ to $1\times10^{20}$ atoms/cm$^3$. In another embodiment, in which the first conductivity type is n-type, the n-type dopant is present in a concentration ranging from $1\times10^{14}$ atoms/cm$^3$ to $1\times10^{19}$.

The dopant concentration that provides the first conductivity type of the first crystalline semiconductor material that provides the absorption layer 10 may be graded or uniform. By "uniform" it is meant that the dopant concentration is the same throughout the entire thickness of the first crystalline semiconductor material that provides the absorption layer 10. For example, a absorption layer 10 having a uniform dopant concentration may have the same dopant concentration at the upper surface and bottom surface of the first crystalline semiconductor material that provides the absorption layer, as well as the same dopant concentration at a central portion of the first crystalline semiconductor material between the upper surface and the bottom surface of the absorption layer 10. By "graded" it is meant that the dopant concentration varies throughout the thickness of the absorption layer 10. For example, an absorption layer 10 having a graded dopant concentration may have an upper surface with a greater dopant concentration than the bottom surface of the absorption layer 10, and vice versa. In another example, the greatest dopant concentration of the first crystalline semiconductor material that provides the absorption layer 10 may be present in a central portion of the absorption layer 10 between the upper surface and the bottom surface of the absorption layer 10. In some embodiments, the dopant gas flow ratio may be varied during epitaxial growth via plasma enhanced chemical vapor deposition to provide an absorption layer 10 having a graded dopant concentration.

In one example, the absorption layer 10 has a thickness ranging from 2 nm to 100 nm, and the first conductivity type is provided by a p-type dopant of boron is present in a concentration ranging from $10^{14}$ atoms/cm$^3$ to $10^{19}$ atoms/cm$^3$.

The band gap of the absorption layer 10 can be from 0.1 eV to 7.0 eV.

In one embodiment, a back surface field layer 5 is present underlying the absorption layer 10. The back surface field layer 5 can serve to passivate the back surface of the absorption layer 10, and reduce electron-hole recombination. The back surface field layer 5 is typically doped to the same conductivity type, i.e., first conductivity type, as the absorption layer 10. Therefore, in the embodiments in which the first conductivity type of the crystalline semiconductor material of the absorption layer 10 is p-type, the back surface field layer 5 is doped to provide a p-type conductivity, and in the embodiments in which the first conductivity type of the crystalline semiconductor material of the absorption layer 10 is n-type, the back surface field layer 5 is doped to provide an n-type conductivity.

The back surface field layer 5 may be composed of the same or a different material as the crystalline semiconductor material of the absorption layer 10. Typically, the back surface field layer 5 is composed of a silicon containing material, such as Si, Ge, SiGe, SiC, SiGeC and combinations thereof. The back surface field layer 5 may also be a compound semiconductor, such as type III-IV semiconductors, e.g., GaAs. The back surface field layer 5 can have the same or different crystal structure as the crystalline semiconductor material that provides the absorption layer 10. For example, the back surface field layer 5 may have a single crystal crystalline structure or a polycrystalline crystal structure. In one example, the back surface field layer 5 is composed of single crystal Si. In some embodiments, the back surface field layer 5 can be an epitaxial crystalline layer. An epitaxial crystalline layer is a material layer having the same crystallographic characteristics, such as crystal structure, as the material layer on which it is formed. For example, the back surface field layer 5 may be an epitaxial layer 5 having the same crystal structure as the absorption layer 10, on which the back surface field layer 5 is grown. In one embodiment, the back surface field layer 5 has a thickness ranging from 2 nm to 10 μm. In another embodiment, the back surface field layer 5 has a thickness ranging from 5 nm to 5 μm.

The dopant that dictates the conductivity type of the back surface field layer 5 is typically present in the back surface field layer 5 in a greater concentration than the dopant that dictates the concentration type of the crystalline semiconductor material that provides the absorption layer 10. In one embodiment, the concentration of the dopant that provides the conductivity type of the back surface field layer 5 typically ranges from $10^{17}$ atom/cm$^3$ to $10^{21}$ atom/cm$^3$. In another embodiment, the concentration of the dopant that provides the conductivity type of the back surface field layer 5 ranges from $10^{19}$ atom/cm$^3$ to $10^{20}$ atom/cm$^3$. The back surface field layer 5 is optional, and may be omitted from the photovoltaic device of the present disclosure.

The absorption layer 10 and the back surface field layer 5 may be formed from a semiconductor substrate. In one embodiment, the semiconductor substrate can provide the absorption layer 10, and the optionally back surface field layer 5 can be deposited onto the semiconductor substrate. For example, the back surface field layer 5 can be deposited onto the semiconductor substrate that provides the absorption layer 10 using chemical vapor deposition (CVD). CVD is a deposition process in which a deposited species is formed as a result of chemical reaction between gaseous reactants, wherein the solid product of the reaction is deposited on the surface on which a film, coating, or layer of the solid product is to be formed. Variations of CVD processes suitable for depositing the back surface field layer 5 include, but are not limited to, Atmospheric Pressure CVD (APCVD), Low Pressure CVD (LPCVD) and Plasma Enhanced CVD (PECVD), Metal-Organic CVD (MOCVD) and combinations thereof. In one example, the back surface field layer 5 may be formed using a low temperature PECVD process similar to the low temperature PECVD process that epitaxially forms the second crystalline semiconductor layer 15 on the absorption layer 10. The details of this low temperature PECVD process are described below. In another embodiment, the back surface field layer 5 can be formed into the semiconductor substrate that provides the absorption layer 10 using a diffusion method. For example, the dopant that provides the conductivity type of the back surface field layer 5 may be introduced to the semiconductor substrate using ion implantation or gas vapor phase deposition, and then diffused into a depth of the semiconductor substrate to provide the back surface field layer 5. The methods by which the absorption layer 10 and the back surface field layer 5 are formed are provided for illustrated purposes only, and are not intended to limit the present disclosure.

Still referring to FIG. 1, the second crystalline semiconductor layer 15 having the second conductivity type may be epitaxially grown on the absorption layer 10 of the first crystalline semiconductor material having the first conductivity type. The second crystalline semiconductor layer 15 provides at least a component of the emitter of the solar cell. The second crystalline semiconductor layer 15 may be composed of a silicon containing material, such as Si, Ge, SiGe, SiC, SiGeC and combinations thereof. The second crystalline semiconductor layer 15 may also be a compound semiconductor, such as type III-IV semiconductors, e.g., GaAs. The second conductivity type of the second crystalline semiconductor layer 15 is opposite the conductivity type of the absorption layer 10. Therefore, when the absorption layer 10 has a p-type conductivity, the second crystalline semiconductor layer 15 has an n-type conductivity, and when the absorption layer 10 has an n-type conductivity, the second crystalline semiconductor layer 15 has a p-type conductivity.

In a silicon containing second crystalline semiconductor layer 15, examples of p-type dopants, i.e., impurities, include but are not limited to, boron, aluminum, gallium and indium. In one embodiment, in which the second conductivity type of the second crystalline semiconductor layer 15 is p-type, the p-type dopant is present in a concentration ranging from $10^{16}$ atoms/cm$^3$ to $10^{21}$ atoms/cm$^3$. In another embodiment, in which the second conductivity type of the second crystalline semiconductor layer 15 is p-type, the p-type dopant is present in a concentration ranging from $10^{18}$ atoms/cm$^3$ to $5\times10^{20}$ atoms/cm$^3$. In a silicon containing second crystalline semiconductor layer 15, examples of n-type dopants, i.e., impurities, include but are not limited to, antimony, arsenic and phosphorous. In one embodiment, in which the second conductivity type is n-type, the n-type dopant is present in a concentration ranging from $10^{16}$ atoms/cm$^3$ to $10^{21}$ atoms/cm$^3$. In another embodiment, in which the second conductivity type is n-type, the n-type dopant is present in a concentration ranging from $10^{18}$ atoms/cm$^3$ to $5\times10^{20}$ atoms/cm$^3$.

The thickness of the second crystalline semiconductor layer 15 may range from 2 nm to 2 μm. In another embodiment, the thickness of the second crystalline semiconductor layer 15 ranges from 3 nm to 500 nm. Typically, as the thickness of the emitting layer 15 decreases the dopant concentration that dictates the conductivity type of the second crystalline layer 15 is increased. In one example, the second crystalline semiconductor layer 15 has a thickness ranging from 5 nm to 15 nm, and the second conductivity type is provided by an n-type dopant of phosphorus that is present in a concentration ranging from $10^{18}$ atoms/cm$^3$ to $2\times10^{19}$ atoms/cm$^3$.

The band gap of the second crystalline semiconductor layer 15 can be from 0.5 eV to 2.0 eV.

As indicated above, the second crystalline semiconductor layer 15 having the second conductivity type is epitaxially grown on the absorption layer 10. "Epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in the embodiments in which the first crystalline material of the absorption layer 10 has a single crystal crystalline structure, the second crystalline semiconductor layer 15 that is epitaxially grown on the absorption layer 10 will also have a single crystal crystalline structure. Further, in the embodiments in which the first crystalline material of the absorption layer 10 has a polycrystalline or multi-crystalline structure, the second crystalline semiconductor layer 15 that is epitaxially grown on the absorption layer 10 will also have a polycrystalline or multi-crystalline structure.

Figure 2A:
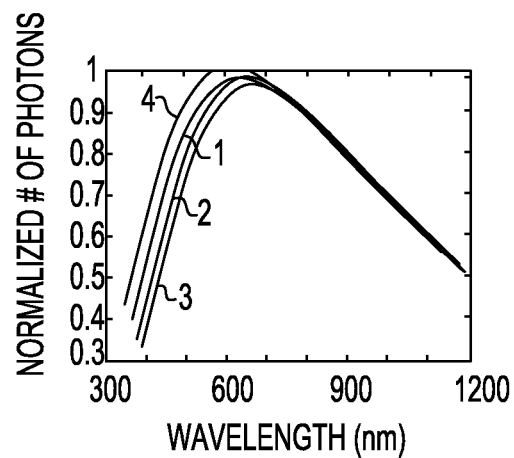
FIG. 2(a) is a plot of wavelength (nm) of sunlight vs. a normalized number of phonons for 5 nm, 10 nm, and 15 nm thicknesses of intrinsic amorphous hydrogenated silicon (i a-Si:H) as employed in a photovoltaic device.
Figure 2B:
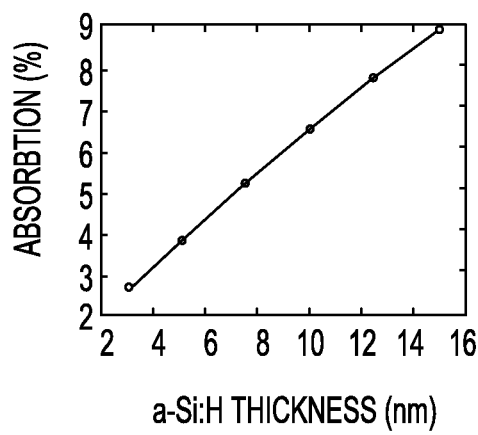
FIG. 2(b) is a plot of the thickness of a layer of intrinsic amorphous hydrogenated silicon (i a-Si:H) vs. the % absorption of sunlight of the layer of intrinsic amorphous hydrogenated silicon (i a-Si:H) as employed in a photovoltaic device.

The second crystalline semiconductor layer 15 replaces the intrinsic amorphous hydrogenated silicon (a-Si:H) that is typically formed on the absorption layer of prior HIT solar cells. The term "amorphous" denotes that the intrinsic amorphous hydrogenated silicon lacks a specific crystal structure. By replacing the intrinsic amorphous hydrogenated silicon with the second crystalline semiconductor layer 15, the present disclosure decreases the absorption of phonons of sunlight before the phonons of sunlight are converted into charge carriers. FIGS. 2(a) and 2(b) illustrate the absorption effect of intrinsic amorphous hydrogenated silicon as employed in a solar cell. FIG. 2(a) is a plot of wavelength (nm) of sunlight vs. normalized number of phonons, in which the data line identified by reference number 1 illustrates the absorption of a HIT solar cell including a 5 nm thick layer of intrinsic amorphous hydrogenated silicon, the data line identified by reference number 2 illustrates the absorption of an HIT solar cell including a 10 nm thick layer of intrinsic amorphous hydrogenated silicon, and the data line identified by reference number 3 illustrates the absorption of an HIT solar cell including a 15 nm thick layer of intrinsic amorphous hydrogenated silicon. The data line identified by reference number 4 is the absorption measured from a control solar cell in which an intrinsic amorphous hydrogenated silicon is not present. FIG. 2(b) is a plot of the thickness of a layer of intrinsic amorphous hydrogenated silicon (i a-Si:H) vs. the % absorption of sunlight of the layer of intrinsic amorphous hydrogenated silicon as employed in a solar cell. As illustrated in FIGS. 2(a) and 2(b), phonon absorption by the intrinsic amorphous hydrogenated silicon increases as the thickness of the layer of the intrinsic amorphous hydrogenated silicon increases.

By replacing the intrinsic amorphous hydrogenated silicon with the second crystalline semiconductor layer 15 to provide at least a portion of the emitter component of the solar cell, the present disclosure substantially reduces phonon absorption in the emitter before the phonons of sunlight are converted into charge carriers. For example, an emitter including the second crystalline semiconductor layer 15 having the second conductivity type that is formed in accordance with the present disclosure reduces phonon absorption in the emitter component of the solar cell by 1% to 10% when compared to a similarly structured HIT solar cell having an emitter composed of intrinsic amorphous hydrogenated silicon.

Although the present disclosure does not employ intrinsic amorphous hydrogenated silicon as a component of the emitter of the solar cell, the present disclosure does enable the low temperature processing that is consistent with the temperatures used in forming intrinsic amorphous hydrogenated silicon for HIT solar cells. More specifically, the plasma enhanced chemical vapor deposition (PECVD) method of present disclosure allows for the second crystalline semiconductor layer 15 to be epitaxially formed on the absorption layer 10 at temperatures of less than 500° C., e.g., less than 200° C. The temperatures disclosed herein for the epitaxial growth of the second crystalline semiconductor layer 15 are measured at the deposition surface, and may also be referred to as substrate temperatures. Plasma enhanced chemical vapor deposition (PECVD) is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration.

The second crystalline semiconductor layer 15 is epitaxially grown via plasma enhanced chemical vapor deposition (PECVD) from a mixture of silane ($SiH_4$), hydrogen ($H_2$) and dopant gasses. Other gases such as $SiF_4$, $GeH_4$ and $CH_4$ may be used for growing c-Ge (crystalline germanium), c-SiGe, or incorporating C into the c-Si (crystalline silicon), c-Ge (crystalline germanium) or c-SiGe (crystalline silicon germanium) film. In one embodiment, to provide epitaxial growth of a second crystalline semiconductor layer 15 composed of a silicon containing material and doped to a second conductivity, e.g., n-type conductivity or p-type conductivity, at temperatures of less than 500° C., the ratio of silane precursor gas ($SiH_4$) to hydrogen gas ($H_2$) is selected to be greater than 5:1. In another embodiment, the ratio of silane ($SiH_4$) to hydrogen ($H_2$) ranges from 5:1 to 1000:1. For example, epitaxial growth of silicon is possible at temperatures as low as 150° C. with ratios of silane ($SiH_4$) to hydrogen ($H_2$) ranging from 5:1 to 20:1.

The dopant gasses of the low temperature PECVD process provide the conductivity type of the second crystalline semiconductor layer 15. More specifically, as the second crystalline semiconductor layer 15 is epitaxially grown it is in-situ doped. The in-situ doping of the n-type dopants can be effected by adding a dopant gas including at least one p-type dopant, e.g., phosphorus or arsenic, into the gas stream into the process chamber. For example, when phosphorus is the n-type dopant, the dopant gas can be phosphine ($PH_3$), and when arsenic is the n-type dopant, the dopant gas can be arsine ($AsH_3$). In one example, when the second conductivity type dopant is n-type, the dopant gasses include phosphine gas ($PH_3$) present in a ratio to silane ($SiH_4$) ranging from 0.01% to 10%. In another example, when the second conductivity type dopant is n-type, the dopant gasses include phosphine gas ($PH_3$) present in a ratio to silane ($SiH_4$) ranging from 0.1% to 2%. In one example, a second crystalline semiconductor layer 15 of single crystal silicon was epitaxial grown on a single crystal absorbing layer 10 at a temperature of 150° C., wherein the second crystalline semiconductor layer 15 has an n-type conductivity provided by phosphorus dopant present in a concentration greater than $1 \times 10^{20}$ cm$^{-3}$.

The in-situ doping of p-type dopant to provide the second conductivity type in the second crystalline semiconductor layer 15 can be effected with a dopant gas including at least one p-type dopant, e.g., B, into the gas stream into the process chamber. For example, when boron is the p-type dopant, the dopant gas can be diborane ($B_2H_6$). In one embodiment, wherein the second conductivity type dopant is p-type, the dopant gasses for forming the second crystalline semiconductor layer 15 may be diborane ($B_2H_6$) present in a ratio to silane ($SiH_4$) ranging from 0.01% to 10%. In another embodiment, wherein the second conductivity type dopant is p-type, the dopant gasses for forming the second crystalline semiconductor layer 15 may be diborane ($B_2H_6$) present in a ratio to silane ($SiH_4$) ranging from 0.1% to 2%. In yet another embodiment, in which the second conductivity type dopant is p-type, the dopant gasses for forming the second crystalline semiconductor layer 15 may be trimethylboron (TMB) present in a ratio to silane ($SiH_4$) ranging from 0.1% to 10%.

The dopant that is introduced to the second crystalline semiconductor layer 15 may be uniform in concentration or may have a graded concentration. By "uniform" it is meant that the dopant concentration is the same throughout the entire thickness of the second crystalline semiconductor layer 15. For example, a second crystalline semiconductor layer 15 having a uniform dopant concentration may have the same dopant concentration at the upper surface and bottom surface of the second crystalline semiconductor layer 15, as well as the same dopant concentration at a central portion of the second crystalline semiconductor layer 15 between the upper surface and the bottom surface of the second crystalline semiconductor layer 15. By "graded" it is meant that the dopant concentration varies throughout the thickness of the second crystalline semiconductor layer 15. For example, a second crystalline semiconductor layer 15 having a graded dopant concentration may have an upper surface with a greater dopant concentration than the bottom surface of the second crystalline semiconductor layer 15, and vice versa. In another example, the greatest dopant concentration of the second crystalline semiconductor layer 15 may be present in a central portion of the second crystalline semiconductor layer 15 between the upper surface and the bottom surface of the second crystalline semiconductor layer 15.

In one embodiment, to provide a graded dopant concentration in the second crystalline semiconductor layer 15, the gas flow ratio for the dopant gas may be varied during epitaxial growth of the second crystalline semiconductor layer by PECVD. In the embodiments, in which the second crystalline semiconductor layer 15 that is composed of silicon germanium (SiGe) or silicon doped with carbon (Si:C), the carbon (C) or germanium (Ge) dopant may be graded by varying the gas flow ratio for the gas precursors that provide the carbon and/or germanium during the epitaxial growth of the second crystalline semiconductor layer 15.

The pressure for the low temperature PECVD process for epitaxially growing the second crystalline semiconductor layer 15 ranges from 10 mTorr to 5 Torr, and in one example may be in the range of 250 mtorr to 900 mTorr. The power density for the low temperature PECVD process for epitaxially growing the second crystalline semiconductor layer 15 may range from 1 mW/cm$^2$ to 100 mW/cm$^2$, and in one example may be in the range of 3 mW/cm$^2$ to 10 mW/cm$^2$. Further details regarding the epitaxial growth process for forming the second crystalline semiconductor layer 15 of the present disclosure are described in U.S. patent application Ser. No. 13/032,866 titled "Ultra Low-temperature selective epitaxial growth of Silicon for CMOS and 3D integration"), which is owned by the assignee of the present disclosure, and is incorporated herein by reference.

Figure 3:
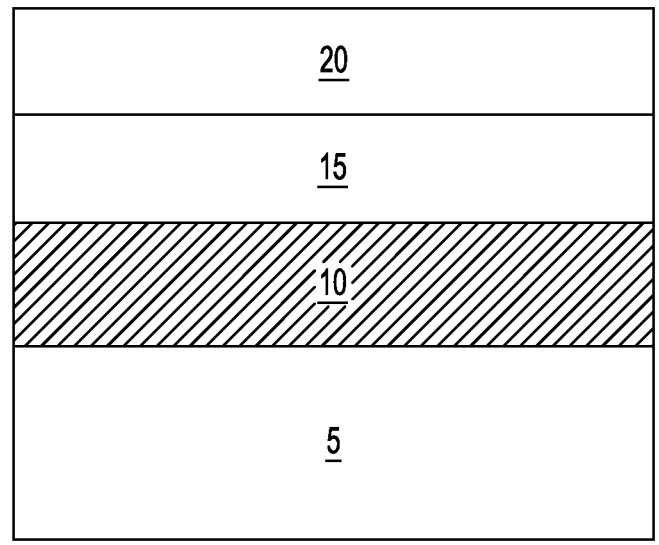
FIG. 3 is a side cross-sectional view of forming a passivation layer composed of an intrinsic amorphous semiconductor material on the second crystalline semiconductor layer, in accordance with one embodiment of the present disclosure.

FIG. 3 depicts one embodiment of forming a passivation layer 20 composed of an intrinsic amorphous semiconductor material on the second crystalline semiconductor layer 15. The term "intrinsic semiconductor", also called an undoped semiconductor or i-type semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). The passivation layer 20 can serve to passivate the upper surface of the second crystalline semiconductor layer 15, and reduce electron-hole recombination. The intrinsic amorphous semiconductor material that provides the passivation layer 20 is typically, but not necessarily always hydrogenated. Typically, the passivation layer 20 is composed of intrinsic amorphous hydrogenated silicon (i a-Si:H). Typically, the thickness of the passivation layer 20 is from 100 nm to 1 micron, although lesser and greater thicknesses can also be employed.

The passivation layer 20 is formed utilizing any physical or chemical vapor deposition process including any semiconductor precursor source material. In some embodiments, the intrinsic hydrogenated semiconductor containing material is deposited in a process chamber containing a semiconductor precursor source gas and a carrier gas including hydrogen. Hydrogen atoms in the hydrogen gas within the carrier gas are incorporated into the deposited material to form the intrinsic hydrogenated semiconductor containing material of the intrinsic semiconductor layer 20. The passivation layer 20 is optional, and may be omitted.

Figure 4:
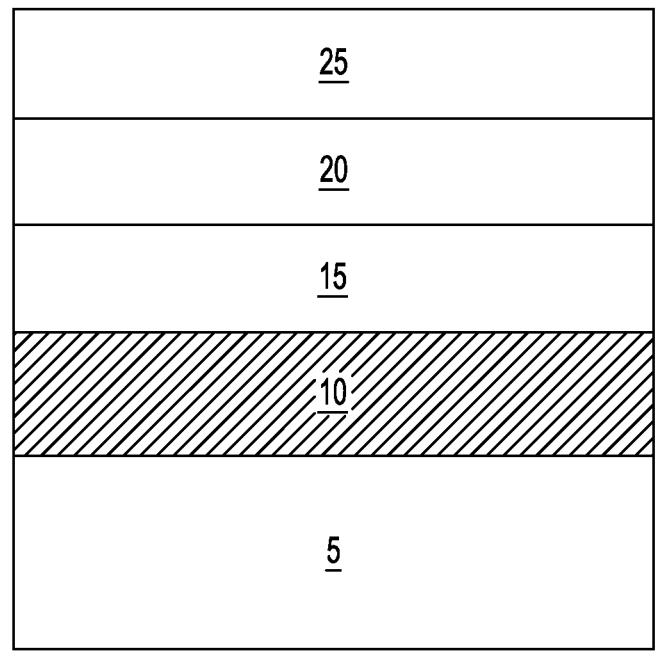
FIG. 4 is a side cross-sectional view of one embodiment of forming a transparent conductive material layer on the passivation layer composed of the intrinsic amorphous semiconductor material, in accordance with one embodiment of the present disclosure.

FIG. 4 depicts one embodiment of forming a transparent conductive material layer 25 on the passivation layer 20 composed of the intrinsic amorphous semiconductor material. Throughout this disclosure an element is "transparent" if the element is sufficiently transparent in the visible electromagnetic spectral range. The transparent conductive material layer 25 includes a conductive material that is transparent in the range of electromagnetic radiation at which photogeneration of electrons and holes occur within the solar cell structure. In one embodiment, the transparent conductive material layer 25 can include a transparent conductive oxide such as, but not limited to, a fluorine-doped tin oxide ($SnO_2$:F), an aluminum-doped zinc oxide (ZnO:Al), tin oxide (SnO) and indium tin oxide ($InSnO_2$, or ITO for short). The thickness of the transparent conductive material layer 25 may vary depending on the type of transparent conductive material employed, as well as the technique that was used in forming the transparent conductive material. Typically, and in one embodiment, the thickness of the transparent conductive material layer 25 ranges from 20 nm to 500 nm. Other thicknesses, including those less than 20 nm and/or greater than 500 nm can also be employed. The optimum thickness of TCO for minimizing reflection from the surface of Si is in the range of 70 nm to 110 nm. The transparent conductive material layer 25 is typically formed using a deposition process, such as sputtering or CVD. Examples of CVD processes suitable for forming the transparent conductive material layer 25 include, but are not limited to, APCVD, LPCVD, PECVD, MOCVD and combinations thereof. Examples of sputtering are included but not limited to RF and DC magnetron sputtering.

The top, bottom, or both surfaces of the absorption layer 10, and/or the top surface of the transparent conductive material layer 25 may be textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled surface will typically be deflected to propagate through the device at an oblique angle, thereby increasing the length of the path taken to reach the device's back surface, as well as making it more likely that photons reflected from the device's back surface will impinge on the front surface at angles compatible with total internal reflection and light trapping. In one embodiment, the texturing of the transparent conductive material layer 25, e.g., TCO, is achieved utilizing a hydrogen based wet etch chemistry, such as, for example, etching in HCl. In some embodiments, the textured upper surface can be achieved during formation, i.e., deposition, of the transparent conductive material layer 25. The transparent conductive material layer 25 is optional, and may be omitted. In one embodiment, the texturing of the single-crystalline Si absorbing layer 10 is achieved utilizing a KOH based wet etch chemistry to realize random pyramids, or inverted pyramids.

Figure 5A:
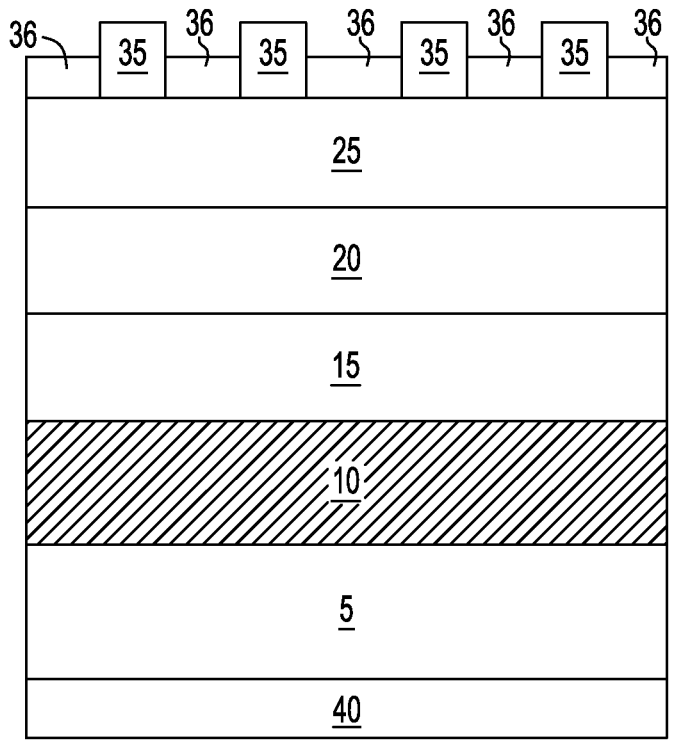
FIG. 5A is a side cross-sectional view of one embodiment of forming a front contact in direct contact with the transparent conductive material layer, and a back contact to the back surface field region of the absorption layer, in accordance with one embodiment of the present disclosure.

FIG. 5A depicts one embodiment of forming a front contact 35 (also referred to as an emitter contact 35) in direct contact with the transparent conductive material layer 25, and a back contact 40 in electrical communication with the absorption layer 10. In the embodiment that is depicted in FIG. 5A, the back contact 40 is in direct contact with the back surface field layer 5, but in the embodiments in which the back surface field layer 5 is omitted, the back contact 40 may be in direct contact with the absorption layer 10. In the embodiment that is depicted in FIG. 5A, the front contact 35 is in direct contact with the transparent conductive material layer 25, but in the embodiments in which the transparent conductive material layer 25 is omitted, the front contact 35 may be in direct contact with the passivation layer 20. In yet another embodiment, in which both the transparent conductive material layer 25 and the passivation layer 20 are omitted, the front contact 35 may be in direct contact with the second crystalline semiconductor layer 15.

In one embodiment, the front contact 35 of a solar cell consists of a set of parallel narrow finger lines and wide collector lines deposited typically at a right angle to the finger lines. The front contact 35 may be deposited with a screen printing technique. In another embodiment, the front contact 35 is provided by the application of an etched or electroformed metal pattern. The metallic material used in forming the metal pattern for the front contact 35 may include applying a metallic paste. The metallic paste may be any conductive paste, such as Al paste, Ag paste or AlAg paste. The metallic material used in forming the metal pattern for the front contact 35 may also be deposited using sputtering or plating. The thickness of the front contact 35 can range from 100 nm to 10 micrometers, although lesser and greater thicknesses can also be employed. In some embodiments, forming the front contact 35 may include applying an antireflection (ARC) coating 36. The antireflection coating (ARC) 36 may be composed of silicon nitride ($SiN_x$) or silicon oxide ($SiO_x$) grown by PECVD at temperatures as low as 200° C. In another example, the antireflective coating (ARC) 36 may be a dual layer structure composed of zinc-sulfide (ZnS) and magnesium fluoride ($MgF_2$).

In some embodiments, the back contact 40 is deposited on the optional back surface field layer 5 or the absorption layer 10. The back contact 40 may be blanket deposited using a physical vapor deposition (PVD) method, such as sputtering or plating. The back contact 40 may be composed of any conductive material, such as aluminum, and may have a thickness ranging from 100 nm to 10 micrometers, although lesser and greater thicknesses can also be employed.

Figure 5B:
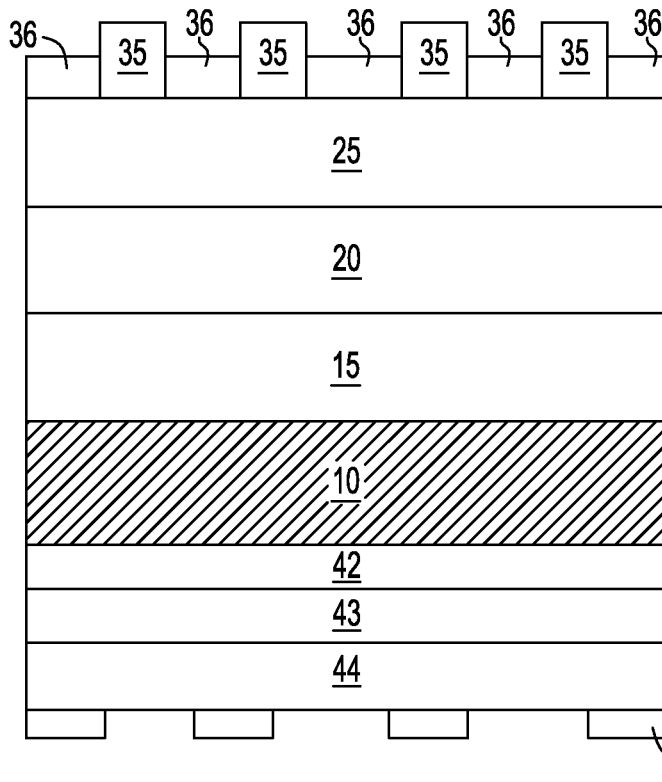
FIG. 5B is a side cross-sectional view of another embodiment of forming a back contact in electrical communication with the absorption layer, wherein an intrinsic amorphous semiconductor material layer and a doped amorphous semiconductor material layer are present between the absorption layer and the back contact, in accordance with the present disclosure.

FIG. 5B depicts another embodiment of forming a back contact 41 in electrical communication with the absorption layer 10, wherein an intrinsic amorphous semiconductor material layer 42 and a doped amorphous semiconductor material layer 43 are present between the absorption layer 10 and the back contact 41. The photovoltaic device, e.g., solar cell, depicted in FIG. 5B includes a transparent conductive material layer 25, a passivation layer 20, a second crystalline semiconductor layer 15, and an absorption layer 10 composed of a first crystalline semiconductor layer, as described in FIGS. 1-5A. In this embodiment, the back surface field layer 5 may be omitted. An intrinsic amorphous semiconductor material layer 42 may be present in direct contact with the absorption layer 10. The intrinsic amorphous semiconductor material layer 42 may be similar in composition and method of formation as the passivation layer 20, that is described above with reference to FIG. 3. Therefore, the description of the passivation layer 20 discussed above with reference to FIG. 3 is suitable for the intrinsic amorphous semiconductor material layer 42 that is depicted in FIG. 5B.

In one embodiment, a doped amorphous semiconductor material layer 43 is in direct contact with the intrinsic amorphous semiconductor material layer 42. The doped amorphous semiconductor material 43 may be composed of a silicon containing layer, such as silicon, silicon germanium, or silicon doped with carbon (Si:C). The doped amorphous semiconductor material 43 may be deposited using a chemical vapor deposition (CVD) process, such as plasma enhanced chemical vapor deposition (PECVD). Examples of suitable silicon-containing reactant gas for PECVD deposition include $SiH_4$, $SiH_2Cl_2$, $SiHCl_3$, $SiCl_4$, and $Si_2H_6$. Examples of germanium-containing reactant gas for PECVD include $GeH_4$, $GeH_2Cl_2$, $GeCl_4$, and $Ge_2H_6$. The doped amorphous semiconductor material layer 43 may have a conductivity type that is the same as the absorbing layer 10. In one embodiment, the doped amorphous semiconductor layer 43 is doped to a p-type conductivity that is introduced to the doped amorphous semiconductor material layer 43 using an in-situ doping process. The in-situ doping of the p-type dopants into a silicon containing doped amorphous semiconductor material layer 43 can be effected by adding a dopant gas including at least one p-type dopant, e.g., B, In, and Ga, into the gas stream into the process chamber of the PECVD device.

A backside transparent conductive material layer 44 may be in direct contact with the doped amorphous semiconductor material layer 43. The backside transparent conductive material layer 44 is similar in composition and method of manufacturing to the transparent conductive material layer 25 that is described above with reference to FIG. 4. In one embodiment, the metal layer may be substituted for the backside transparent conductive material layer 44. The metal layer may be an aluminum containing layer that is deposited using a physical vapor deposition (PVD) process, such as sputtering or plating.

Still referring to FIG. 5B, a back contact 41 may then be formed in contact with the backside transparent conductive material layer 44 or the metal layer. In one embodiment, the back contact 41 may be similar in composition and method of manufacturing as the front contact 35.

Figure 5C:
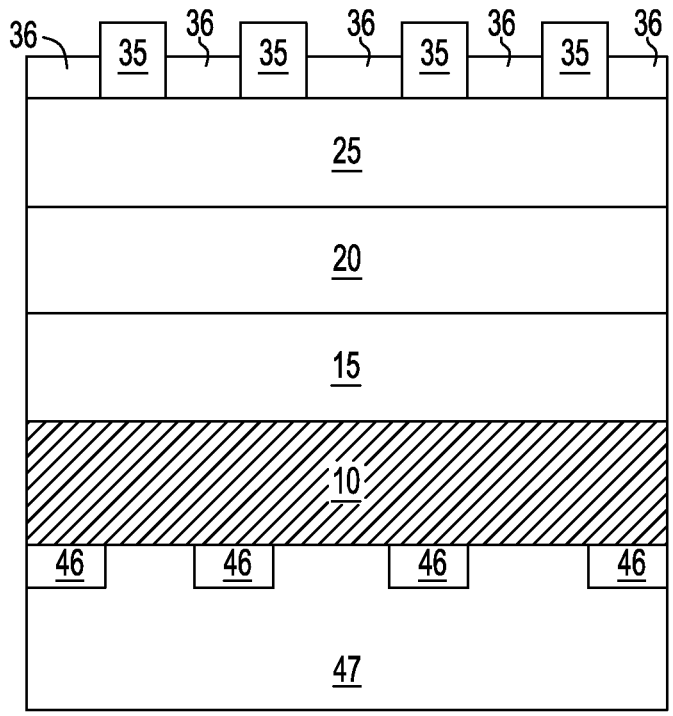
FIG. 5C is a side cross-sectional view of a photovoltaic device including a localized back contact in electrical communication with the absorption layer, wherein the localized back contact includes a patterned dielectric material that provides openings to the absorption layer, and a metal contact in direct contact with the back surface of the absorption layer that is deposited within the openings, in accordance with one embodiment of the present disclosure.

FIG. 5C depicts one embodiment of a photovoltaic device including a localized back contact in electrical communication with the absorption layer 10. The localized back contact includes a patterned dielectric layer 46 that provides openings to the absorption layer 10, and a metal contact 47 in direct contact with the back surface of the absorption layer 10 that is deposited within the openings. The patterned dielectric layer 46 may function as a passivation layer, and may be composed of an oxide, nitride or oxynitride material, e.g., silicon oxide or silicon nitride. The openings that are formed through the patterned dielectric layer 46 may be produced using photolithography and etching. The metal contact 47 may be deposited within the openings in the patterned dielectric layer 46 using a physical vapor deposition (PVD) process, such as sputtering or plating. In one example, the metal contact 47 may be composed of aluminum, but other metals are suitable for providing the metal contact 47. The photovoltaic device, e.g., solar cell, depicted in FIG. 5C also includes a transparent conductive material layer 25, a passivation layer 20, a second crystalline semiconductor layer 15, and an absorption layer 10 composed of a first crystalline semiconductor layer, as described in FIGS. 1-5B.

Figure 5D:
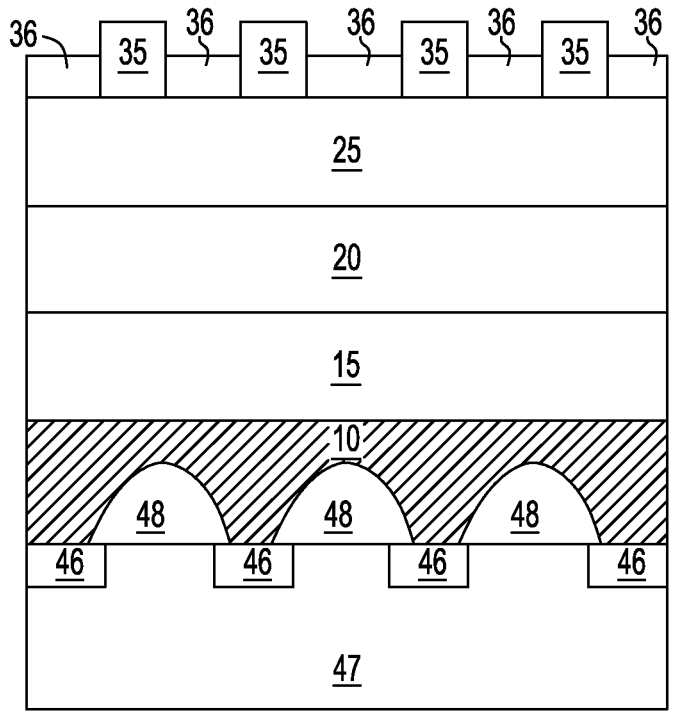
FIG. 5D is a side cross-sectional view of a photovoltaic device including a localized back surface field, in accordance with one embodiment of the present disclosure.

FIG. 5D depicts one embodiment of a photovoltaic device including a localized back surface field. The photovoltaic device depicted in FIG. 5D is similar to the photovoltaic device depicted in FIG. 5C with the exception that the photovoltaic device that is depicted in FIG. 5D further includes a localized back surface field 48. The photovoltaic device, e.g., solar cell, depicted in FIG. 5D includes a transparent conductive material layer 25, a passivation layer 20, a second crystalline semiconductor layer 15, an absorption layer 10 composed of a first crystalline semiconductor layer, a patterned dielectric layer 46, and a metal contact 47, as described in FIGS. 1-5C. The localized back surface field 48 may be provided by a doped region in the absorption layer 10. In one embodiment, the doped region that provides the localized back surface field 48 has the same conductivity type as the absorption layer 10. For example, the absorption layer 10 and the localized back surface field 48 may both be doped to a p-type conductivity. Typically, the dopant concentration that provides the conductivity type of the absorption layer 10 and the localized back surface field 48, is greater in the localized back surface field 48 than in the absorption layer 10. For example, the dopant concentration of the p-type dopant in the absorption layer 10 may range from $10^{18}$ atoms/cm$^3$ to $10^{21}$ atoms/cm$^3$, and the dopant concentration of the p-type dopant in the localized back surface field regions 48 may range from $10^{19}$ atoms/cm$^3$ to $10^{20}$ atoms/cm$^3$. The dopant that provides the localized back surface field 48 may be introduced through the openings in the patterned dielectric layer 46 into an exposed surface of the absorption layer 10 by ion implantation or diffusion, or by the combination thereof, prior to the formation of the metal contact 47.

The following example is given to illustrate the effect of replacing the emitter component of the solar cell that is composed of intrinsic amorphous hydrogenated silicon with the second crystalline semiconductor layer 15 of the present disclosure, in which the second crystalline semiconductor layer 15 is epitaxially grown at a temperature of less than 500° C. on the absorption layer 10. Because this examples is given for illustrative purposes only, the present disclosure should not be interpreted as being limited thereto.

Figure 6:
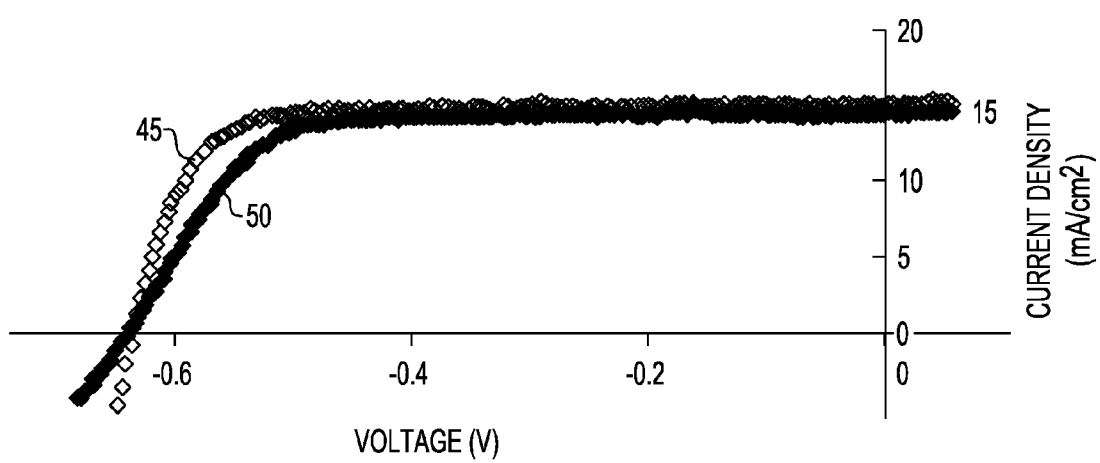
FIG. 6 is a plot of voltage as a function of current density measured from a photovoltaic device under illumination, in accordance with the present disclosure.

FIG. 6 is a plot of voltage as a function of current density measured from a photovoltaic device including an emitter composed of the second crystalline semiconductor layer 15 having the second conductivity type that is epitaxially grown at a temperature of less than 500° C. on the absorption layer 10 of the first crystalline semiconductor material that has the first conductivity type, as described above with reference to FIG. 1-5A. The data line identified by reference number 45 is measured from a solar cell including a second crystalline semiconductor layer 15 as depicted in FIG. 5A. The data line identified by reference number 50 is measured from a control solar cell, in which at least a portion of the emitter component of the solar cell includes a intrinsic amorphous hydrogenated silicon. The structure of the control solar cell is similar to the solar cell depicted in FIG. 5A with the exception that the second crystalline semiconductor layer 15 is replaced with an intrinsic amorphous hydrogenated silicon layer (serving as a passivation layer), and the passivation layer 20 is replaced with doped a-Si:H—with opposite doping type to that of the absorbing layer 10—(serving as the emitting layer). FIG. 2 depicts that the short circuit current density (current density measured at voltage of 0) of the solar cell including the second crystalline semiconductor layer 15 shows an approximately 5% improvement when compared to the short circuit current density of the control solar cell. The thickness of the absorbing layer 10 is 2 μm in both solar cells.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A method of forming a photovoltaic device comprising:
    providing a semiconductor substrate as an absorption layer, the semiconductor substrate comprised of a first crystalline semiconductor material having a first conductivity type;
    epitaxially growing a second crystalline semiconductor layer having a second conductivity type that is opposite the first conductivity type on the semiconductor substrate as an emitter layer by plasma enhanced chemical vapor deposition at a temperature of less than 500° C., wherein the second crystalline semiconductor layer has a crystalline structure the same as a crystalline structure of the semiconductor substrate throughout an entire thickness of the second crystalline semiconductor layer, and wherein the second crystalline semiconductor layer forms a p-n homojunction with the semiconductor substrate; and
    forming contacts in electrical communication with the semiconductor substrate and the second crystalline semiconductor layer.

2. The method of claim 1, wherein the temperature of the epitaxially growing the second crystalline semiconductor layer is 200° C. or less.

3. The method of claim 1, wherein the first conductivity type is p-type and the second conductivity type is n-type, or the first conductivity type is n-type and the second conductivity type is p-type.

4. The method of claim 1, wherein the semiconductor substrate has a single crystal crystalline structure, the semiconductor substrate having a thickness ranging from 50 nm to 1 mm, and having a dopant concentration that provides the first conductivity type of the semiconductor substrate that ranges from $10^9$ atoms/cm$^3$ to $10^{20}$ atoms/cm$^3$.

5. The method of claim 1, wherein the semiconductor substrate has a single crystal crystalline structure, and the epitaxially growing of the second crystalline semiconductor layer produces a single crystal crystalline structure for the second crystalline semiconductor layer, wherein the second crystalline semiconductor layer has a thickness ranging from 2 nm to 2 um, and the second crystalline semiconductor layer has a dopant concentration that ranges from $10^{16}$ atoms/cm$^3$ to $5\times10^{20}$ atoms/cm$^3$.

6. The method of claim 1, wherein the epitaxially growing of the second crystalline semiconductor layer comprises flowing a mixture of silane (SiH$_4$), hydrogen (H$_2$) and dopant gasses into a process chamber.

7. The method of claim 6, wherein the ratio of silane (SiH$_4$) to hydrogen (H$_2$) is greater than 5:1.

8. The method of claim 7, wherein the ration of silane (SiH$_4$) to hydrogen (H$_2$) ranges from 5:1 to 1000:1.

9. The method of claim 7, wherein the second conductivity type dopant is n-type, the dopant gasses comprise phosphine gas (PH$_3$) present in a ratio to silane (SiH$_4$) ranging from 0.01% to 10%, or the dopant gasses comprise arsenic gas (AsH$_3$) present in a ratio to silane (SiH$_4$) ranging from 0.01% to 10%.

10. The method of claim 9, wherein the second conductivity type dopant is p-type, the dopant gasses comprise diborane gas (B$_2$H$_6$) present in a ratio to silane (SiH$_4$) ranging from 0.01% to 10%, or the dopant gasses comprise trimethylboron gas (TMB) present in a ratio to silane (SiH$_4$) ranging from 0.01% to 10%.

11. The method of claim 1, further comprising forming a passivation layer on the second crystalline semiconductor layer prior to the forming the contacts, the passivation layer comprising an intrinsic amorphous semiconductor material.

12. The method of claim 11, further comprising forming a transparent conductive material layer on the passivation layer.

13. The method of claim 12, wherein the forming the contacts in electrical communication with the semiconductor substrate and the second crystalline semiconductor layer comprises:
    forming a first contact in direct contact with the transparent conductive material layer, wherein the first contact provides electrical communication with the second crystalline semiconductor layer; and
    forming a second contact in direct contact with the semiconductor substrate.

14. The method of claim 13, wherein the first contact comprises a plurality of parallel narrow finger lines and a plurality of wide collector lines deposited at a right angle to the plurality of finger lines.

15. The method of claim 13, wherein the second contact comprises a plurality of metal contacts, the forming the plurality of metal contacts comprising:
- forming a dielectric layer on another side of the semiconductor substrate opposite the second crystalline semiconductor layer;
- forming a plurality of openings through the dielectric layer; and
- depositing the plurality of second contacts within the plurality of openings.

16. The method of claim 15, further comprising forming a plurality of localized back surface fields on the another side of the semiconductor substrate opposite the second crystalline semiconductor layer by introducing dopants of the first conductivity type into portions of the semiconductor substrate, wherein edges of the plurality of localized back surface fields are in contact with the plurality of second contacts.

\* \* \* \* \*